(12) United States Patent
Su et al.

(10) Patent No.: US 9,331,195 B2
(45) Date of Patent: May 3, 2016

(54) SOURCE TIP OPTIMIZATION FOR HIGH VOLTAGE TRANSISTOR DEVICES WHICH INCLUDES A P-BODY EXTENSION REGION

(71) Applicant: Taiwan Semiconductor Manufacturing Company, Ltd., Hsin-Chu (TW)

(72) Inventors: Ru-Yi Su, Yunlin County (TW); Fu-Chih Yang, Kaohsiung County (TW); Chun Lin Tsai, Hsin-Chu (TW); Chih-Chang Cheng, Hsin-Chu (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/153,602

(22) Filed: Jan. 13, 2014

(65) Prior Publication Data

US 2014/0110782 A1    Apr. 24, 2014

Related U.S. Application Data

(63) Continuation of application No. 12/944,959, filed on Nov. 12, 2010, now Pat. No. 8,629,026.

(51) Int. Cl.
| | |
|---|---|
| *H01L 29/78* | (2006.01) |
| *H01L 29/08* | (2006.01) |
| *H01L 29/66* | (2006.01) |
| *H01L 21/225* | (2006.01) |
| *H01L 21/265* | (2006.01) |
| *H01L 29/06* | (2006.01) |

(Continued)

(52) U.S. Cl.
CPC ........ *H01L 29/7816* (2013.01); *H01L 29/0847* (2013.01); *H01L 29/66659* (2013.01); *H01L 29/66681* (2013.01); *H01L 29/7835* (2013.01); *H01L 21/2253* (2013.01); *H01L 21/26513* (2013.01); *H01L 29/0634* (2013.01); *H01L 29/105* (2013.01); *H01L 29/42368* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 4,648,174 A | * | 3/1987 | Temple et al. ................. 438/514 |
| 5,300,454 A | | 4/1994 | Taft et al. |
| 5,300,545 A | | 4/1994 | Kazmierczak et al. |

(Continued)

OTHER PUBLICATIONS

Yuji Suzuki et al., "3-D Effect of Cell Designs on the Breakdown Voltage of Power SOI-LDMOS," Proceedings 1996 IEEE International SOI Conference, Oct. 1996, 0-7803-3315-2, 2 pages.

*Primary Examiner* — Charles Garber
*Assistant Examiner* — Brigitte Paterson
(74) *Attorney, Agent, or Firm* — Haynes and Boone, LLP

(57) ABSTRACT

The present disclosure provides a method for fabricating a high-voltage semiconductor device. The method includes designating first, second, and third regions in a substrate. The first and second regions are regions where a source and a drain of the semiconductor device will be formed, respectively. The third region separates the first and second regions. The method further includes forming a slotted implant mask layer at least partially over the third region. The method also includes implanting dopants into the first, second, and third regions. The slotted implant mask layer protects portions of the third region therebelow during the implanting. The method further includes annealing the substrate in a manner to cause diffusion of the dopants in the third region.

20 Claims, 11 Drawing Sheets (Cross-sectional View)

(51) Int. Cl.
*H01L 29/10* (2006.01)
*H01L 29/423* (2006.01)

(56) References Cited

U.S. PATENT DOCUMENTS

| | | | |
|---|---|---|---|
| 5,382,818 A * | 1/1995 | Pein | 257/347 |
| 5,620,658 A | 4/1997 | Jaunakais | |
| 5,650,658 A * | 7/1997 | Beasom | 257/409 |
| 6,258,670 B1 | 7/2001 | Tung | |
| 6,635,925 B1 * | 10/2003 | Taniguchi et al. | 257/335 |
| 6,638,827 B2 | 10/2003 | Kikuchi et al. | |
| 6,768,172 B2 | 7/2004 | Rumennik et al. | |
| 6,777,749 B2 | 8/2004 | Rumennik et al. | |
| 6,888,210 B2 * | 5/2005 | Jeon et al. | 257/492 |
| 7,091,535 B2 * | 8/2006 | Tsai et al. | 257/285 |
| 7,161,210 B2 | 1/2007 | Nishibe et al. | |
| 7,208,381 B2 * | 4/2007 | Lee | 438/298 |
| 7,534,665 B2 | 5/2009 | Ogura | 438/135 |
| 7,541,248 B2 | 6/2009 | Nitta et al. | |
| 7,554,154 B2 | 6/2009 | Hebert | |
| 7,595,518 B2 | 9/2009 | Lee | |
| 7,691,535 B2 | 4/2010 | Shiozaki et al. | |
| 7,820,342 B2 | 10/2010 | Knaipp et al. | |
| 7,829,947 B2 | 11/2010 | Herbert | |
| 8,198,154 B2 | 6/2012 | Herbert | |
| 2002/0050618 A1 * | 5/2002 | Nishibe et al. | 257/368 |
| 2004/0124478 A1 * | 7/2004 | Nishibe et al. | 257/406 |
| 2004/0232510 A1 | 11/2004 | Petruzzello et al. | |
| 2007/0155108 A1 * | 7/2007 | Lee | 438/298 |
| 2007/0207600 A1 * | 9/2007 | You et al. | 438/527 |
| 2008/0237707 A1 * | 10/2008 | Suzuki et al. | 257/344 |
| 2010/0133611 A1 | 6/2010 | Disney et al. | |
| 2010/0289032 A1 | 11/2010 | Zhang et al. | |
| 2010/0314683 A1 | 12/2010 | Yanagi | |
| 2011/0233714 A1 * | 9/2011 | Lu | 257/493 |
| 2011/0241114 A1 * | 10/2011 | Su et al. | 257/343 |
| 2011/0303977 A1 * | 12/2011 | Huang et al. | 257/339 |
| 2011/0309442 A1 * | 12/2011 | Grote et al. | 257/339 |
| 2012/0104492 A1 * | 5/2012 | Chu et al. | 257/335 |
| 2012/0119265 A1 | 5/2012 | Su et al. | |

* cited by examiner

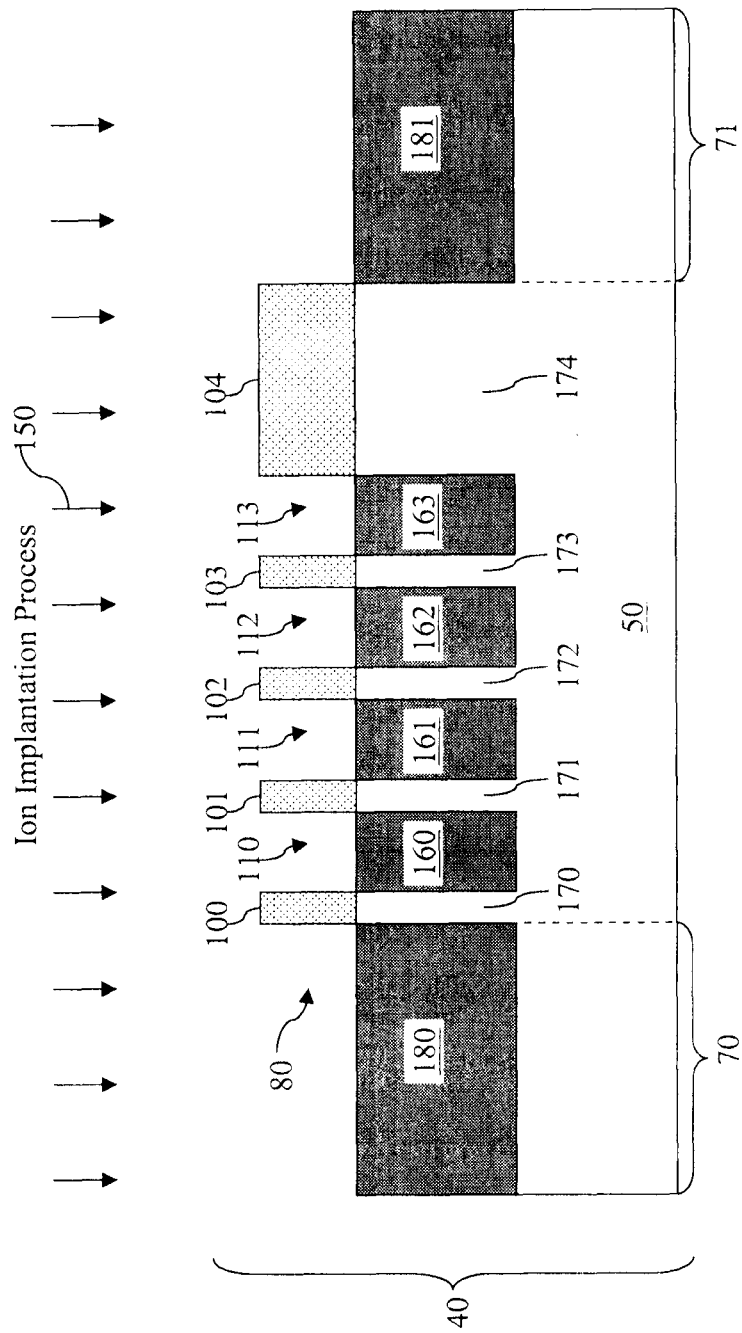
Fig. 3 (Cross-sectional View)

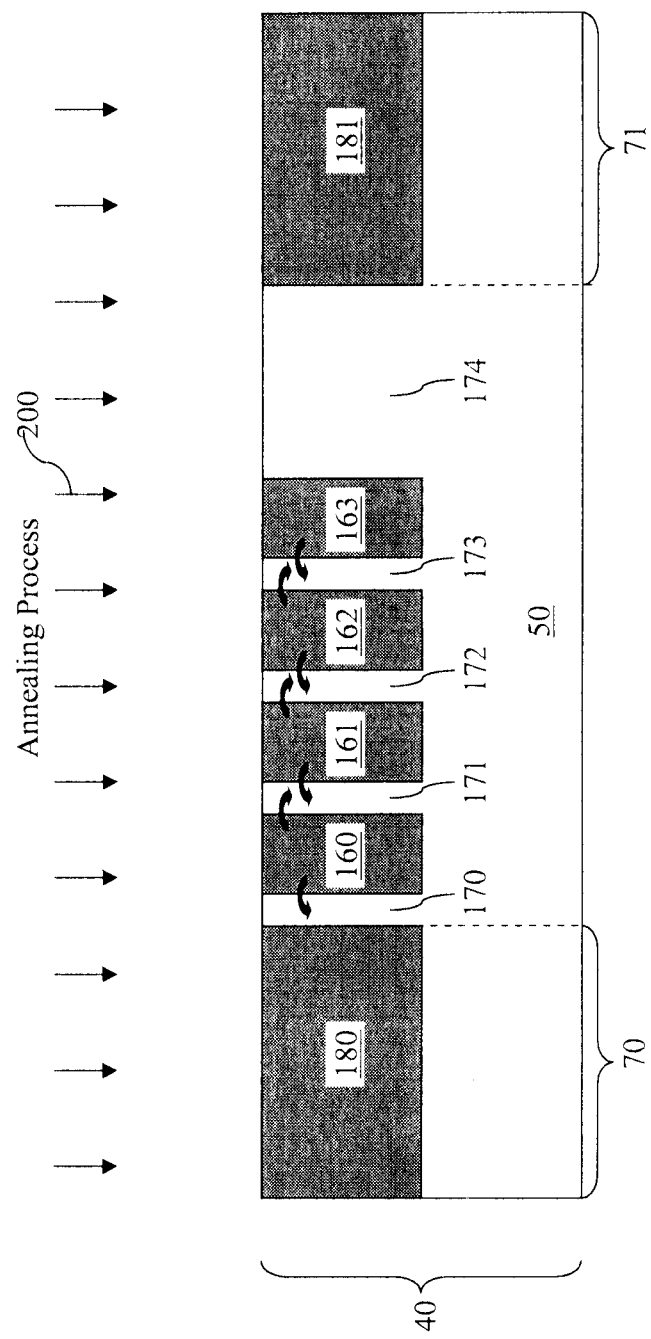

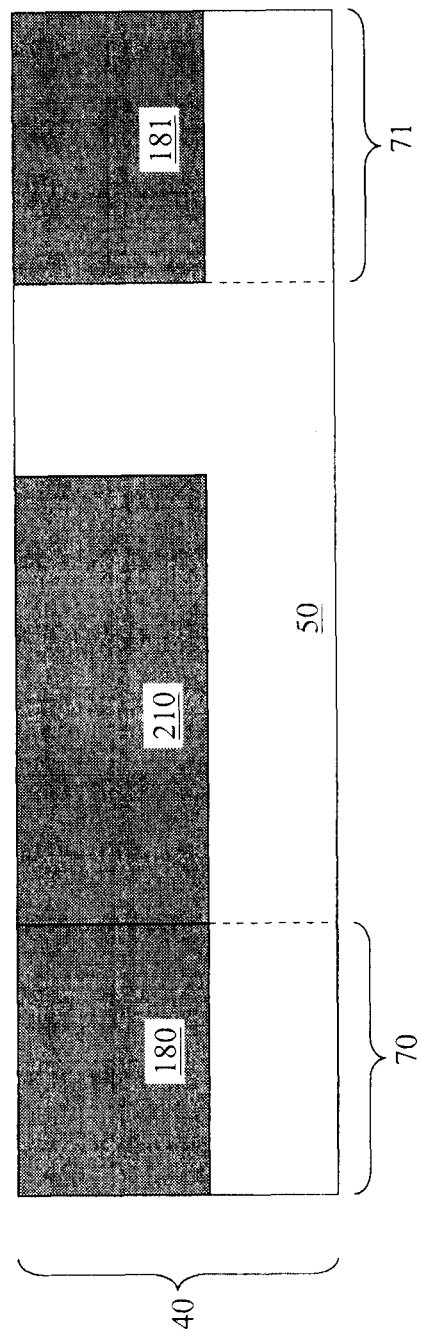
Fig. 5 (Cross-sectional View)

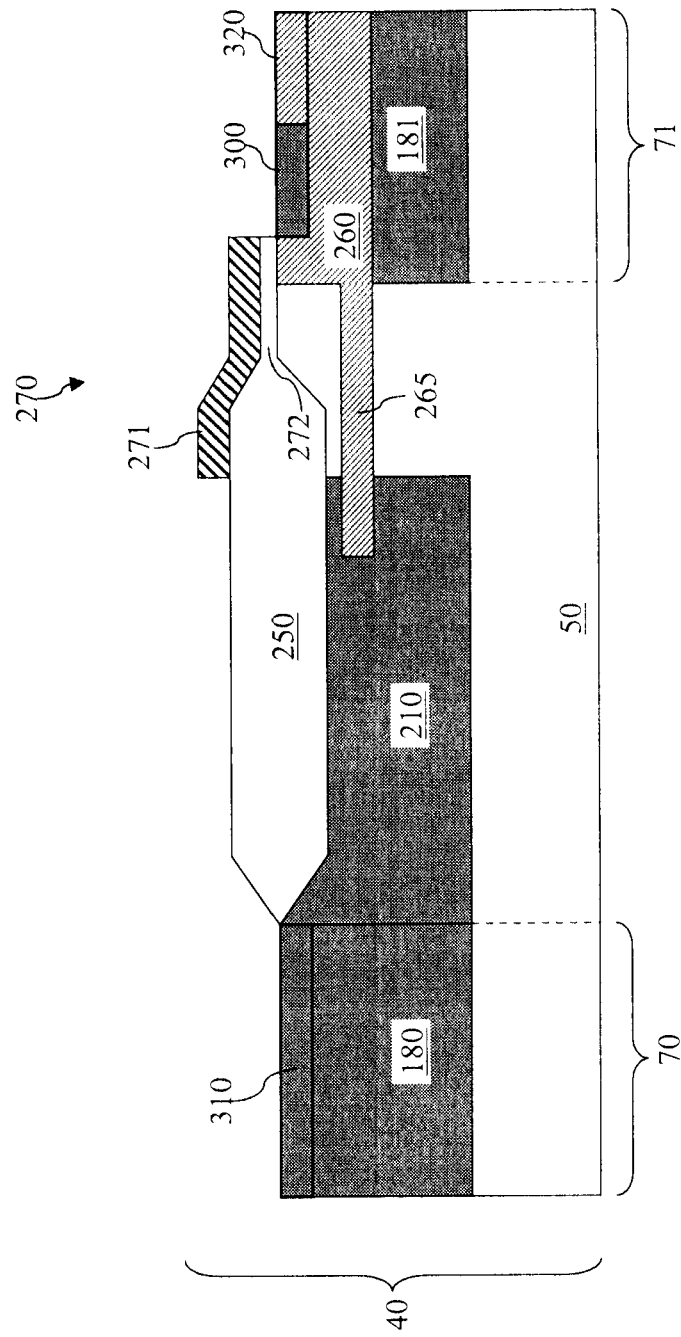
Fig. 6 (Cross-sectional View)

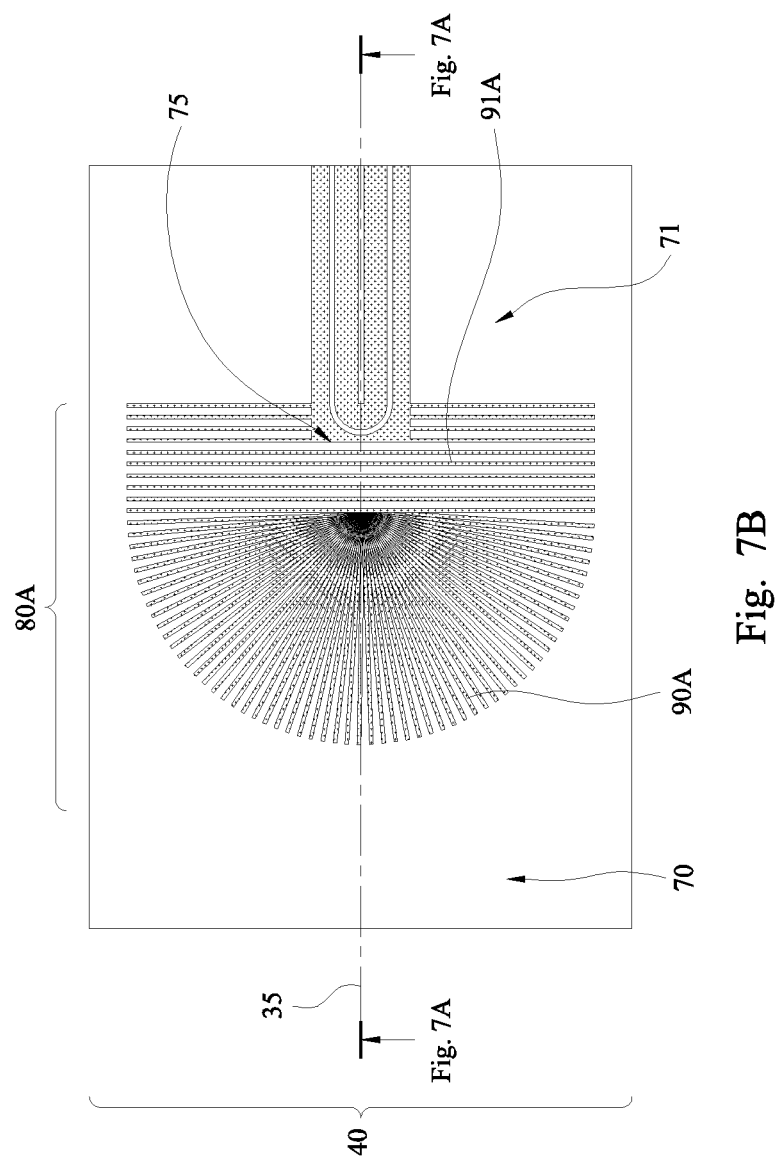

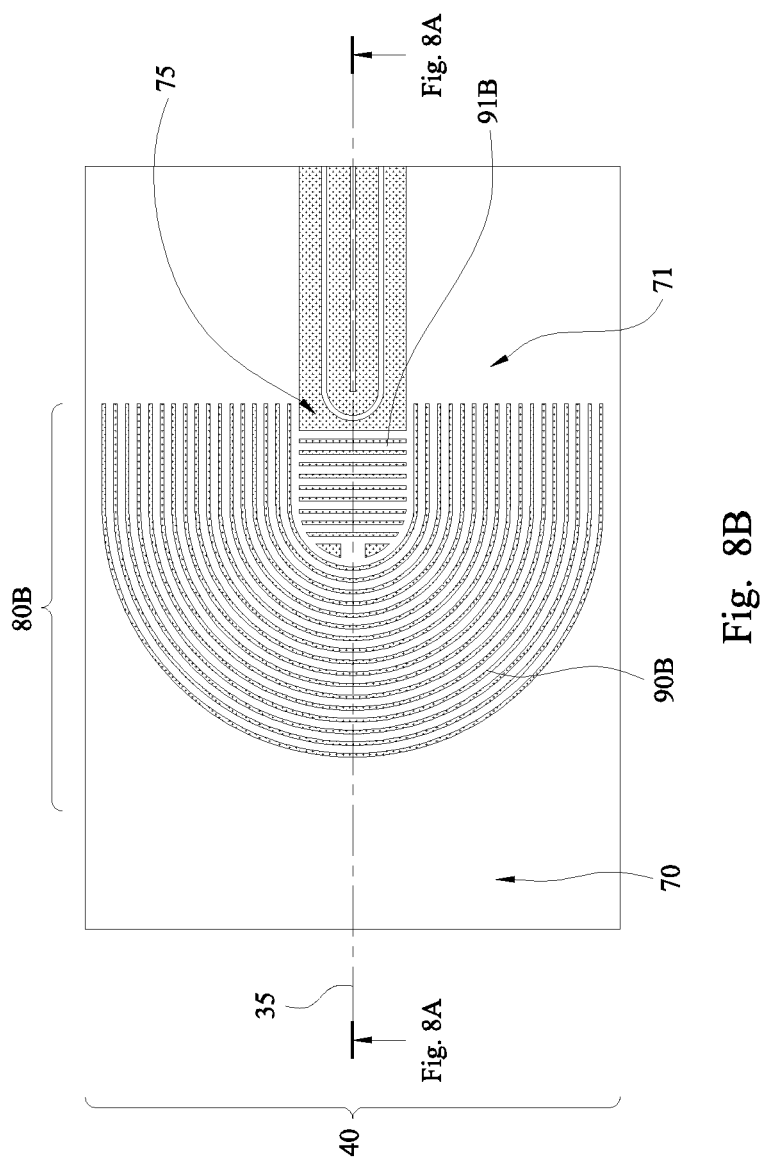

SOURCE TIP OPTIMIZATION FOR HIGH VOLTAGE TRANSISTOR DEVICES WHICH INCLUDES A P-BODY EXTENSION REGION

PRIORITY DATA

This application is a continuation application of U.S. application Ser. No. 12/944,959, filed Nov. 12, 2010, which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

These ICs include high-voltage transistor devices. As geometry size continues to be scaled down, it has become increasingly more difficult for existing high-voltage transistor devices to achieve certain performance criteria. As an example, a breakdown voltage may become a performance limitation for traditional high-voltage transistor devices. Any improvement in the breakdown voltage for these traditional high-voltage transistor devices may lead to an undesirable increase in an on-state resistance of the device.

Therefore, while existing high-voltage transistor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A and 3-6 are diagrammatic fragmentary cross-sectional side views of a high-voltage semiconductor device at various stages of fabrication according to an embodiment of the present disclosure.

FIGS. 2B, 7B, and 8B are diagrammatic fragmentary top views of a high-voltage semiconductor device at a stage of fabrication according to different embodiments of the present disclosure.

DETAILED DESCRIPTION

Figure 1:
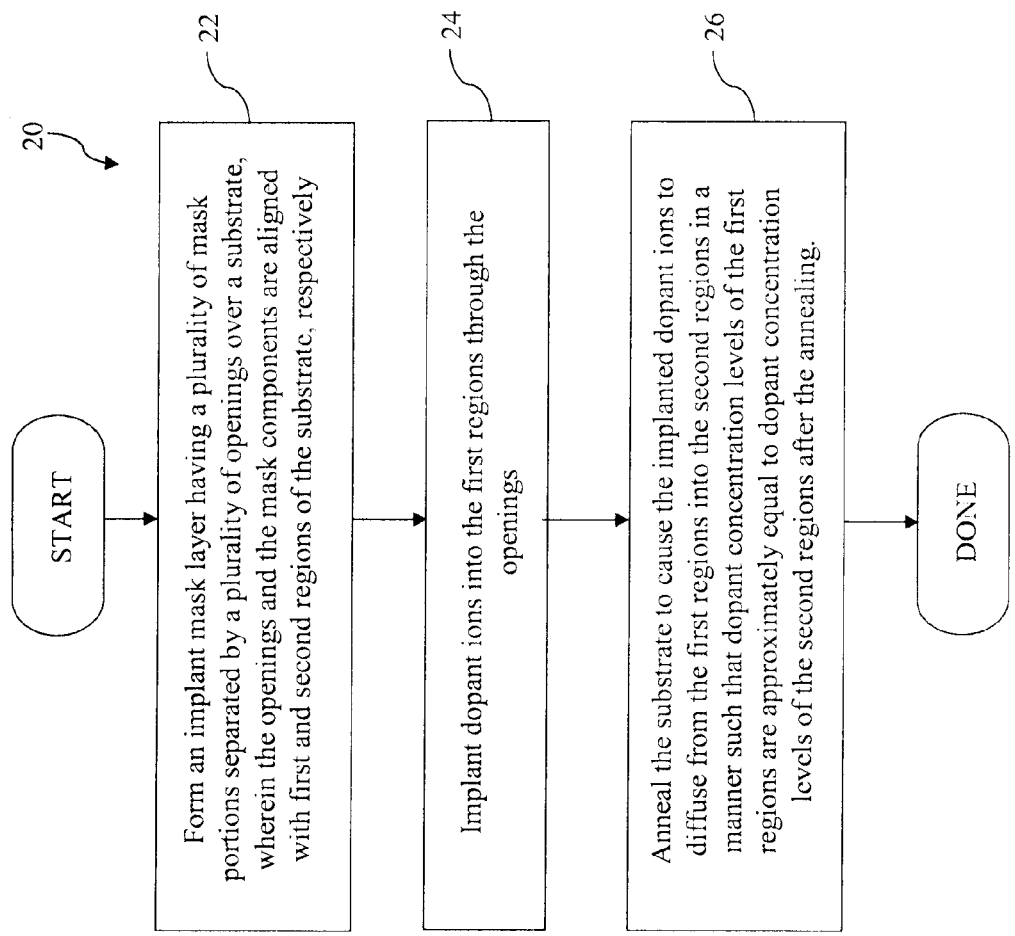
FIG. 1 is a flowchart illustrating a method of fabricating a high-voltage semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 20 for fabricating a semiconductor transistor device. It should be noted that additional processes may be provided before, during, and after the method 20 of FIG. 1, and that some other processes may only be briefly described herein.

Referring to FIG. 1, the method 20 begins with block 22 in which a substrate is provided. An implant mask layer is formed over the substrate. The implant mask layer has a plurality of mask components that are separated by a plurality of openings. The openings are aligned with a plurality of first regions of the substrate, respectively. The mask components are aligned with a plurality of second regions of the substrate, respectively. The method 20 continues with block 24 in which dopant ions are implanted into the first regions of the substrate through the openings. The method 20 continues with block 26 in which the substrate is annealed to cause the implanted dopant ions to diffuse from the first regions into the second regions. The annealing is carried out in a manner such that dopant concentration levels of the first regions are approximately equal to dopant concentration levels of the second regions after the annealing.

FIGS. 2-8 have been simplified for a better understanding of the inventive concepts of the present disclosure. FIGS. 2A and 2B are a diagrammatic fragmentary cross-sectional side view and a diagrammatic fragmentary top view, respectively, of a portion of a high-voltage semiconductor device 40 according to one embodiment. FIG. 2A approximately represents the cross-sectional view that is seen by cutting the top view of FIG. 2B along a cutline 35. It is understood, however, that FIG. 2A and FIG. 2B are each simplified for the sake of simplicity, and they may not have an exact one-to-one correspondence.

Figure 2A:
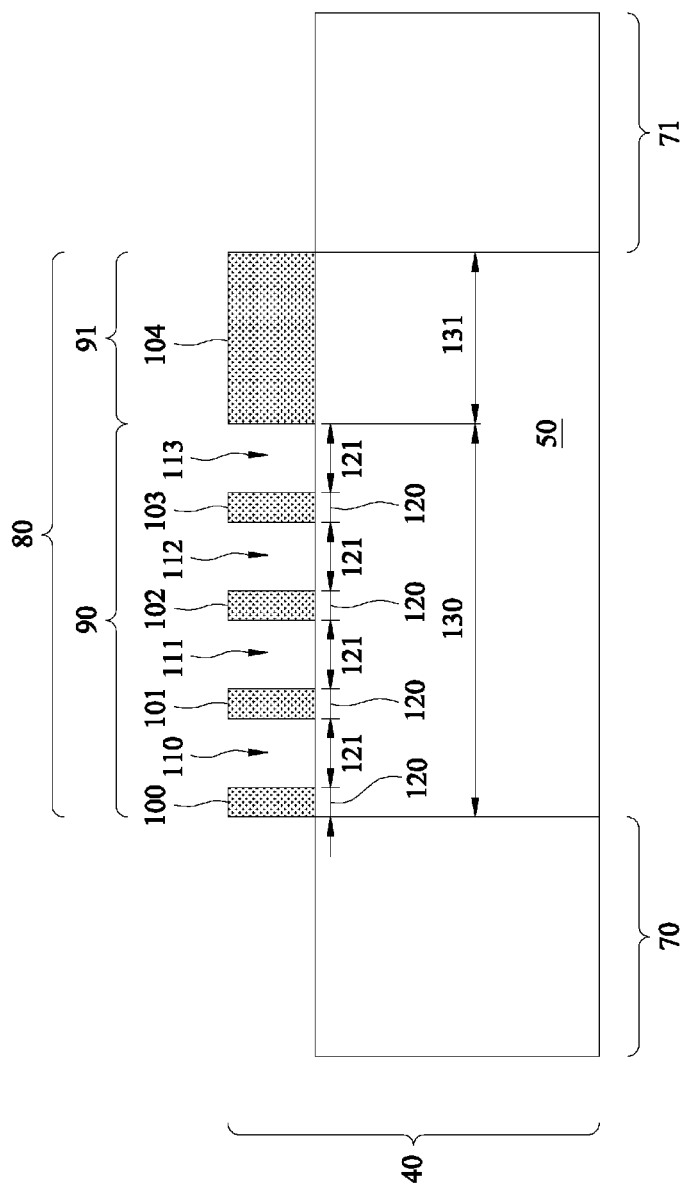

Referring to the cross-sectional view of FIG. 2A, the high-voltage semiconductor device 40 includes a substrate 50. The substrate 50 is a semiconductor substrate in the present embodiment. For example, the substrate 50 may be a silicon substrate. The substrate 50 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The portion of the substrate 50 shown in FIG. 2A is doped with a P-type dopant, such as boron. In an alternative embodiment, the substrate 50 may be doped with an N-type dopant, such as arsenic or phosphorous. The substrate 50 may also include an epi-layer formed at the top.

Figure 2B:
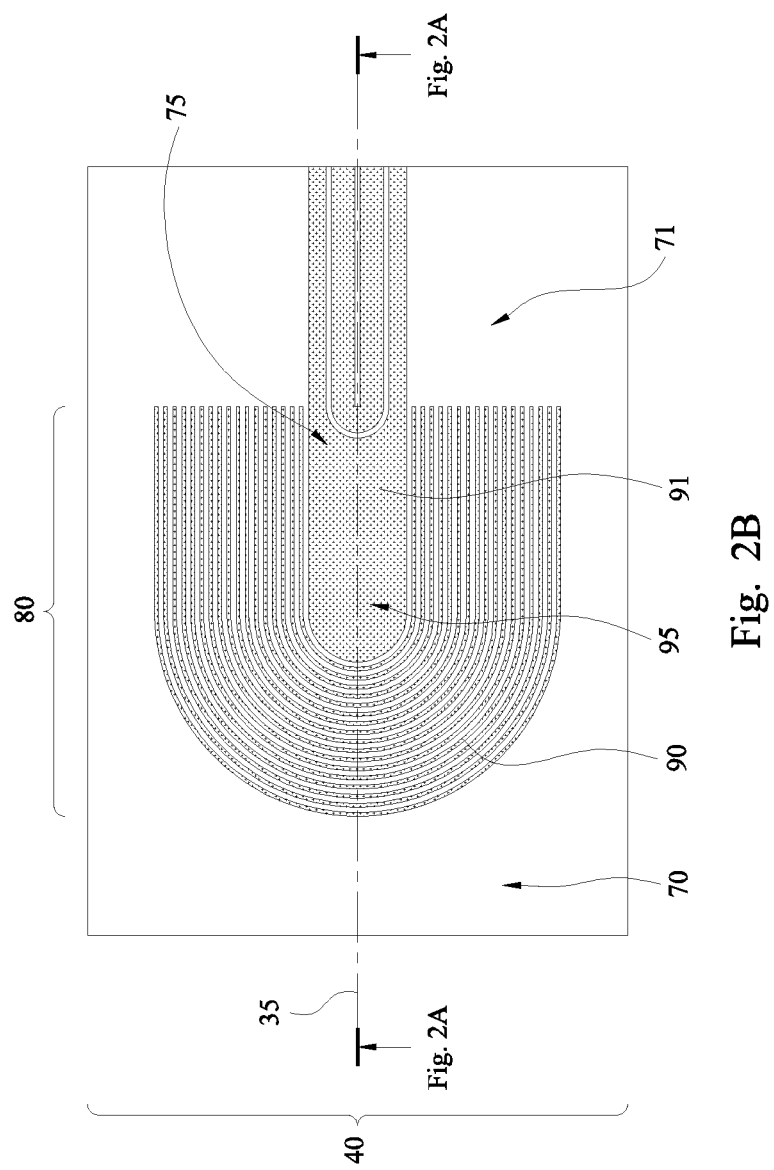

Fabricating the high-voltage semiconductor device 40 includes forming a source and a drain in different portions of the substrate 50. Here, a region 70 of the substrate 50 can be designated as a drain region (in which the drain will eventually be formed), and a different region 71 of the substrate 50 can be designated as a source region (in which the source will eventually be formed). When the source is formed later, it will have a substantially rounded or curved tip portion, referred to as a source tip. The shape of this source tip region is shown in FIG. 2B and designated with the reference numeral 75. Such rounded shape helps reduce the intensity of an electric field when the device is in operation later. However, it is understood that at this stage of fabrication, the source and drain are not actually formed yet. The source tip 75 is shown here merely for purposes of illustration.

An implant mask layer 80 is formed over the substrate 50. The implant mask layer 80 is formed between the regions 70-71 of the substrate 50. In other words, the implant mask layer 80 is formed between the future source region and the future drain region of the high-voltage semiconductor device 40. The implant mask layer 80 has a plurality of mask components separated by a plurality of slots/openings, as can be seen from the top view of FIG. 2B.

In the embodiment shown in FIG. 2B, the implant mask layer 80 has two portions 90 and 91. The "left" side (with reference to FIG. 2B) of the portion 90 has a substantially rounded or curved profile from the top view. This rounded or curved profile approximately resembles a portion of a circle. Such profile helps reduce the intensity of an electric field in a region of the substrate 50 below the implant mask layer while the high-voltage semiconductor device 40 is in operation. The portion 91 is partially surrounded by the portion 90 from the "top", "left", and "bottom" directions (with reference to FIG. 2B). The portion 91 also has a substantially rounded or curved profile 95 toward the left (with reference to FIG. 2B). The slots/openings are all located in the portion 90, and the portion 91 has substantially no slots/openings. Hence, the portion 91 includes a single mask component.

In an embodiment, the implant mask layer 80 includes a photoresist material. In that case, the implant mask layer 80 can be formed by depositing a photoresist layer (for example through a spin-coating process) and then patterning the photoresist layer to form the portions 90-91, including forming the slots/openings of the portion 90. The patterning may be carried out using a photolithography process known in the art, which may include one or more masking, exposing, developing, baking, and rinsing processes (not necessarily in this order). Alternatively, the implant mask layer 80 may include a hard mask material that is patterned by a photoresist mask.

Referring to the cross-sectional view of FIG. 2A, some of the mask components and the slots/openings of the implant mask layer 80 are illustrated to provide a better understanding of the present disclosure. For purposes of simplicity, only a selected number of mask components are shown as mask components 100-104, and only a selected number of slots/openings are shown as slots/openings 110-113. The implant mask layer 80 may contain many more mask components and slots/openings (as can be seen from the top view of FIG. 2B) that are not shown in the cross-sectional view of FIG. 2A for purposes of simplicity and clarity. Also, the mask components 100-103 and the openings 110-113 belong to the portion 90 of the implant mask layer 80, and the mask component 104 belongs to the portion 91 of the implant mask layer 80.

The mask components 100-103 each have a lateral dimension 120, and the openings 110-113 each have a lateral dimension 121 measured in the same direction in which the lateral dimension 120 is measured. In the embodiment shown in FIG. 2A, the lateral direction is a horizontal direction, which is the same direction in which the cutline 35 extends. Similarly, had the cutline 35 been extending in a different direction (for example a vertical direction from the top view), then the lateral dimensions 120-121 would be measured vertically as well. Stated differently, the mask components 100-103 and the slots/openings 110-113 have lateral dimensions that are not measured in a fixed direction only. Because the portion 90 of the implant mask layer 80 is substantially curved or rounded, the lateral dimensions of the mask components 100-103 and the slots/openings may be measured in more than one direction as well. However, regardless of the direction in which these lateral dimensions are measured, the size of each of the lateral dimensions remains approximately equal throughout each mask component or each slot/opening in this embodiment.

The lateral dimension 121 is greater than the lateral dimension 120—meaning that the slots/openings 110-113 are wider than the mask components 100-103. In an embodiment, a ratio of the lateral dimension 121 to the lateral dimension 120 is less than 4:1. For example, the lateral dimension 120 may be approximately equal to 1.6 microns (um), and the lateral dimension 121 may be approximately equal to 3 um, thereby resulting in a ratio of roughly 2:1 between the lateral dimensions 121 and 120.

The portion 90 of the implant mask layer 80 has a total lateral dimension 130 measured in a horizontal direction, which is a sum the lateral dimensions of all the mask components and slots/openings of the portion 90, including the mask components 100-103 and the slots/openings 110-113. The portion 91 of the implant mask layer 80—which is the mask component 104 in the embodiment shown—has a lateral dimension 131 that is measured in the same horizontal direction in which the lateral dimension 130 is measured. In an embodiment, a ratio of the lateral dimension 130 to the lateral dimension 131 is approximately 2:1.

FIGS. 3-5 are diagrammatic fragmentary cross-sectional side views of the high-voltage semiconductor device 40 at various stages of fabrication following the fabrication stage shown in FIG. 2A. The top views of the high-voltage semiconductor device 40 are not shown anymore for reasons of simplicity. Referring now to FIG. 3, an ion implantation process 150 is performed to implant a plurality of dopant ions (also referred to as dopants) to the substrate 50. The dopant ions have the opposite doping polarity as the substrate 50. Thus, in the embodiment where the substrate 50 is P-type doped, the dopant ions implanted by the ion implantation process 150 are N-type ions, such as arsenic or phosphorous ions.

The implant mask layer 80 serves as a protective mask during the ion implantation process 150. Specifically, the mask components 100-104 protect regions of the substrate 50 underneath from being implanted by the dopant ions. However, the regions of the substrate 50 exposed by the slots/openings 110-113 are implanted with dopant ions. Consequently, implanted or doped regions 160-163 are formed in portions of the substrate 50 below the slots/openings 110-113. These implanted regions 160-163 separate un-implanted regions 170-174, which are below the mask components 100-104 and are therefore protected during the ion implantation process 150. Alternatively stated, the implanted regions 160-163 are approximately vertically aligned with the slots/openings 110-113, respectively, and the un-implanted regions 170-174 are approximately vertically aligned with the mask components 100-104, respectively.

In addition to forming the implanted regions 160-163 below the slots/openings 110-113, the ion implantation process 150 also forms doped regions 180 and 181 in regions 70 and 71 of the substrate 50, respectively. The doped/implanted regions 180-181 and 160-163 together serve as an N-drift region for the high-voltage semiconductor device 40. Also, it is understood that in some embodiments, there may be one or more patterned implant mask layers formed over the region 71 (where the source will be formed later). However, these implant mask layers are not illustrated herein for the sake of simplicity and clarity.

Referring now to FIG. 4, the implant mask layer 80 is removed, and an annealing process 200 is performed on the substrate 50 to anneal the various regions of the substrate. The annealing process 200 may include not just a single annealing process but a plurality of annealing processes. These annealing processes may be performed in conjunction with other fabrication processes, and a subsequent annealing process may not immediately follow a previous annealing process.

The annealing process 200 causes the dopant ions from the implanted regions 160-163 to diffuse into adjacent un-implanted regions 170-173. Thus, as the annealing process 200 is being carried out, the dopant concentration levels (also referred to as doping concentration levels) of the implanted regions 160-163 are going down, but the dopant concentration levels of the un-implanted regions 170-173 are going up. The sizes of the implanted regions 160-163 and the un-implanted regions 170-173 are sufficiently small to ensure that the diffusion of dopant ions can be thorough, such that the dopant concentration levels of the implanted regions 160-163 will eventually be substantially equal to the dopant concentration levels of the un-implanted regions 170-173.

The region 174 may receive some dopant ions from the neighboring implanted region 163, but since the region 174 is much bigger in size than the implanted region 163, the amount of dopant ions diffused into the region 174 are negligible with respect to the dopant concentration level of the region 174.

Referring now to FIG. 5, after the annealing process 200 is completed, a doped region 210 is formed as a result of the dopant ions diffusing from the implanted regions 160-163 into the adjacent un-implanted regions 170-173. As discussed above, the doped region 210 will not have segmented dopant concentration levels, because the annealing process 200 (shown in FIG. 5) causes the dopant ions to move around so as to "even out" the dopant concentration levels between the implanted regions 160-163 and the un-implanted regions 170-173. Thus, at a given depth, the doped region 210 has approximately uniform dopant concentration levels at different points along the horizontal direction.

The doped region 210 also has a lower dopant concentration level than the doped region 180 that is nearby. The doped region 180 and the doped region 210 are formed as a result of the same ion implantation process 200 and therefore have the same doping polarity. However, since the doped region 180 do not have the implant mask layer formed thereover (or at least not to the extent of the implant mask layer 80), the dopant ions of the ion implantation process 200 are implanted into the region 180 without obstruction. In comparison, some of the dopant ions are blocked by the mask components 100-103 and therefore could not enter regions 170-173 of the substrate 50, which now constitute parts of the doped region 210. Consequently, the doped region 210 has a reduced dopant concentration level in comparison with the doped region 180.

The difference between the dopant concentration levels of the doped regions 180 and 210 is correlated to relative sizes of the lateral dimensions 120 and 121 (shown in FIG. 2A). This is because the size of the lateral dimension 120 directly affects the amount of dopant ions that can enter (what will later become) the doped region 210. As the size of the lateral dimension 120 increases, the size of the lateral dimension 121 decreases. Consequently, a fewer number of dopant ions will be implanted into the regions 160-163 (shown in FIG. 3), and the overall dopant concentration level of the doped region 210 decreases as a result. Conversely, as the size of the lateral dimension 120 decreases, the size of the lateral dimension 121 increases. Consequently, a greater number of dopant ions will be implanted into the regions 160-163 (shown in FIG. 3), and the overall dopant concentration level of the doped region 210 increases as a result. This means that a ratio of the dopant concentration level of doped region 210 to the dopant concentration level of doped region 180 is approximately equal to a ratio of: (a total area exposed by the openings) to (a sum of: the total area exposed by the openings and the total area of the mask components).

In the embodiment shown here, the correlation between the dopant concentration levels of the doped regions 180 and 210 and the lateral dimensions 120-121 can be expressed by the following mathematical equation:

$$\text{lateral dimension 121}/(\text{lateral dimension 120}+\text{lateral dimension 121}) = \text{dopant concentration level of doped region 210}/\text{dopant concentration level of doped region 180}$$

Applying the above equation using an example where the lateral dimension 121 is approximately twice as big as the lateral dimension 120 according to an embodiment, the dopant concentration level of the doped region 210 is approximately ⅔ of the dopant concentration level of the doped region 180. Therefore, the desired dopant concentration level of the doped region 210 (relative to the dopant concentration level of the doped region 180) can be tuned by adjusting the sizes of the mask components 100-103 and the openings 110-113.

Referring to FIG. 6, a dielectric structure 250 is formed in the substrate 50. The dielectric structure may include a local oxidation of silicon (LOCOS) device in the embodiment illustrated in FIG. 6. In an alternative embodiment, the dielectric structure 250 may include a shallow trench isolation (STI) device instead. At least a portion of the dielectric structure 250 is formed in the doped region 210. The dielectric structure 250 helps define boundaries of active regions, for example boundaries of source and drain regions of the high-voltage device 40.

Thereafter, a doped extension region 260 is formed in the substrate 50. The doped extension region 260 has the same doping polarity as the substrate 50 but an opposite doping polarity as the doped regions 180-181 and 210. Thus, in the embodiment shown, the doped extension region 260 is P-type and as such may also be referred to as a P-body extension region herein.

The doped extension region 260 may be formed by two separate ion implantation processes. The first ion implantation process forms a doped region at least partially in the upper portion of the doped region 181. The second ion implantation process forms a deeper and wider doped region that "extends" or "protrudes" outward toward the doped region 210 or the doped region 180. Subsequently, a thermal process may be performed to inter-diffuse and merge the two doped regions into a single doped region, thereby forming the doped extension region 260. As a result, the doped extension region 260 has a protruding portion 265 that extends toward the doped region 180. In the embodiment shown, the protruding portion 265 protrudes partially into the doped region 210.

After the formation of the doped extension region 260, a gate structure 270 is formed. The gate structure 270 includes a gate electrode 271 that is formed over a portion of the dielectric structure 250 and a gate dielectric 272 that is formed underneath the gate electrode 271. The gate dielectric 272 may be formed differently from the dielectric structure 250, since the fabrication requirements regarding the gate dielectric 272 typically is much stricter than the dielectric structure 250. When the high-voltage semiconductor device 40 is fabricated and is in operation, a conductive channel region will be formed underneath the gate dielectric 272.

After the gate structure 270 is formed, heavy ion implantation processes are used to form the source and drain regions 300 and 310. The source region 300 is formed in the doped extension region 260, and the drain region 310 is formed in the doped region 180. The source and drain regions 300 and 310 both have the same doping polarity as the doped regions 180-181 and 210. Thus, in the embodiment illustrated, the source and drain regions 300 and 310 are N-type doped. Since heavy ion implantation processes are used to form the source and drain regions 300 and 310, the source and drain regions 300 and 310 are "heavily doped", such that they have higher dopant concentration levels than the doped regions 180-181 and 210. Although it can't be seen from the cross-sectional view of FIG. 6, the source region 300 has a substantially rounded or curved tip portion from a top view that extends in a direction toward the drain region 310.

In addition, a heavy ion implantation process is used to form a heavily doped region 320 in the doped extension region 260. The doped region 320 has the same doping polarity as the doped extension region 260 and is therefore P-type doped in the embodiment shown. The doped region 320 has a higher dopant concentration level than the doped extension region 260. In a later fabrication process in which contacts (not illustrated herein) are formed on the source region 300, the drain region 310, and the gate structure 270, the source region contact is formed to be coupled to the doped region 320 as well.

In addition to forming contacts for the source, drain, and the gate, other fabrication processes may be performed to complete the fabrication of the high-voltage semiconductor device 40. These additional fabrication processes may include forming an interlayer dielectric (ILD), forming metal layers and vias interconnecting the metal layers, performing passivation processes, packaging, and testing. For the sake of simplicity, these additional processes are not illustrated herein.

Figure 7A:
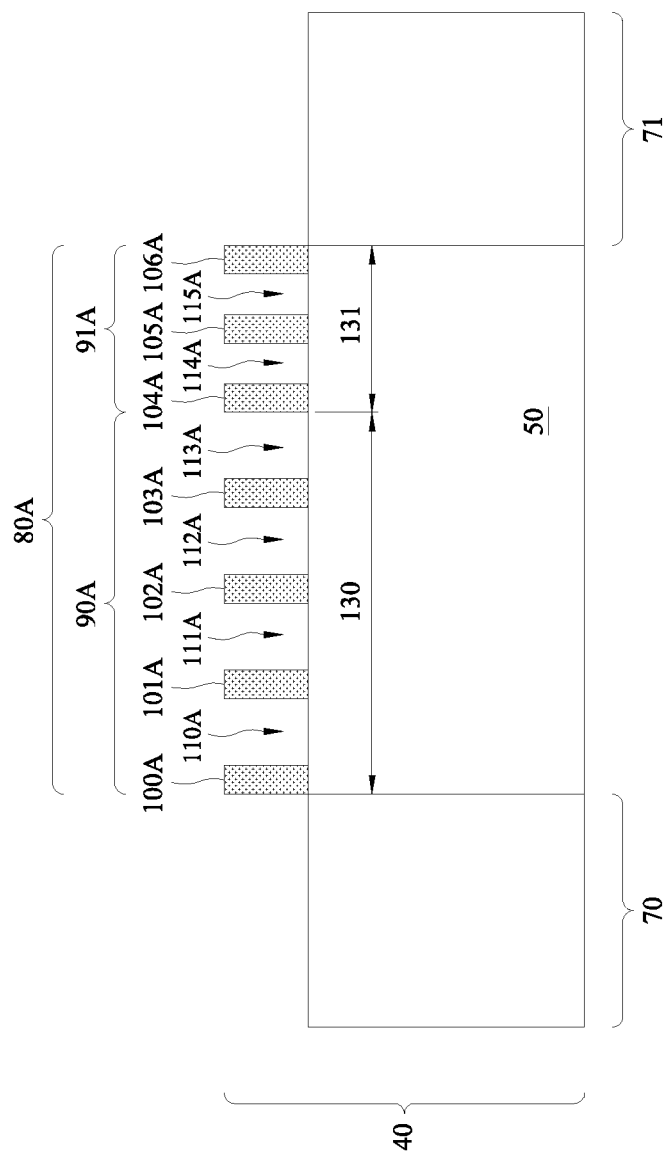
FIGS. 7A and 8A are diagrammatic fragmentary cross-sectional side views of a high-voltage semiconductor device at a stage of fabrication according to different embodiments of the present disclosure.

FIGS. 7A and 7B are a diagrammatic fragmentary cross-sectional side view and a diagrammatic fragmentary top view, respectively, of a portion of the high-voltage semiconductor device 40 according to another embodiment. For purposes of consistency and clarity, some of the elements that are similar to those that appeared in FIGS. 2A and 2B described above are labeled the same in FIGS. 7A and 7B.

Referring to FIGS. 7A and 7B, an implant mask layer 80A is formed on the substrate 50. The implant mask layer 80A has a different geometry than the implant mask layer 80 shown in FIGS. 2A and 2B. For example, the implant mask layer 80A is divided into portions 90A and 91A that are different from the portions 90 and 91 of the implant mask layer 80. The slots/openings of the portion 90A extend radially outwards. The portion 91A is not surrounded by the portions 90A but is located side-by-side to the portion 90A. The portion 91A also includes not just a single mask component but a plurality of mask components separated by slots/openings. Only a selected number of these mask components are illustrated in the cross-sectional view of FIG. 7A as 104A-106A, and a selected number of these slots/openings are illustrated in the cross-sectional view of FIG. 7A as 114A-115A. In other words, the portion 91A of the mask layer 80A contains additional mask components and slots/openings that are not illustrated in FIG. 7A for reasons of simplicity.

Furthermore, the mask components 110A-106A may have different sizes from one another, and the slots/openings 110A-115A may have different sizes from one another. These varying sizes are also not specifically illustrated in the cross-sectional view of FIG. 7A for reasons of simplicity. And similar to the implant mask layer 80, the implant mask layer 80A will also result in a lower dopant concentration level to the regions of the substrate underneath. This results in the following mathematical relationship:

a dopant concentration level of the region corresponding to the doped region 210 in FIG. 5/the dopant concentration level of the region corresponding to the doped region 180 in FIG. 5=a total area of the openings of the implant mask layer 80A/(a total area of the openings of the implant mask layer 80A+a total area of the mask components of the implant mask layer 80A)

Figure 8A:
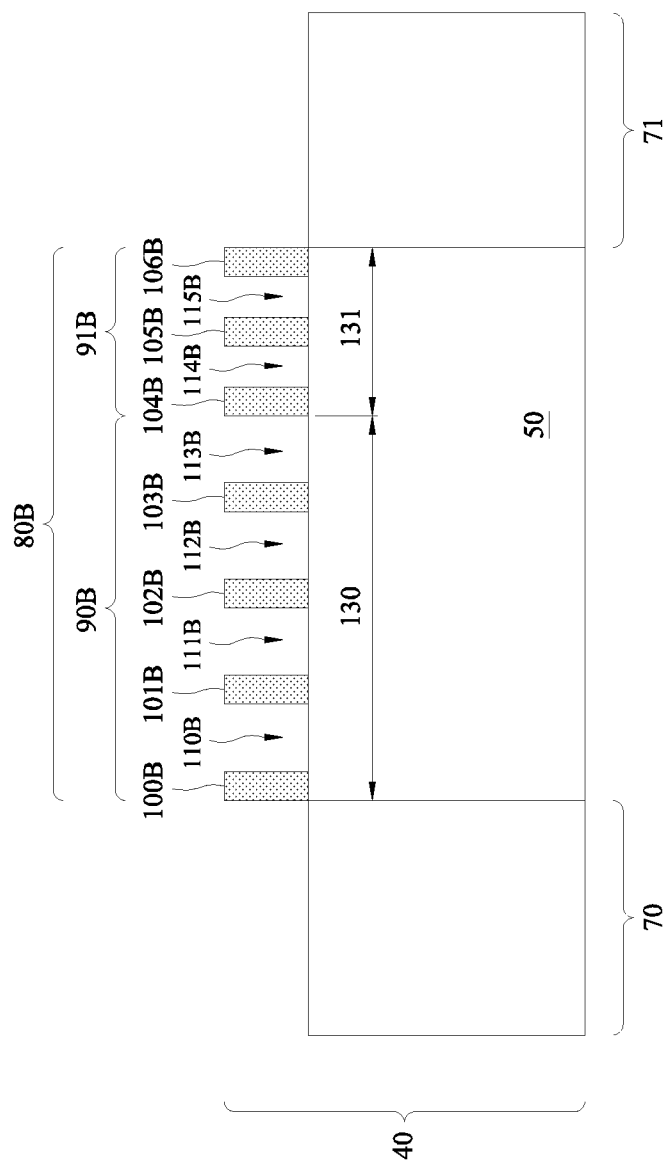

Referring to FIGS. 8A and 8B, an implant mask layer 80B is formed on the substrate 50. The implant mask layer 80B has a different geometry than the implant mask layers 80 and 80A shown in FIGS. 2A-2B and FIGS. 7A-7B. For example, the implant mask layer 80B is divided into portions 90B and 91B that are different from the portions 90-91 of the implant mask layer 80 or the portions 90A-91A of the implant mask layer 80A. Here, the portion 91B is still partially surrounded by the portion 90B, but it includes not just a single mask component. Instead, the portion 90B includes a plurality of mask components separated by slots/openings. For the sake of illustration, a selected number of these mask components are illustrated in the cross-sectional view of FIG. 8A as 104B-106B, and a selected number of these slots/openings are illustrated in the cross-sectional view of FIG. 8A as 114B-115B. In other words, the portion 91B of the mask layer 80B contains additional mask components and slots/openings that are not illustrated in FIG. 8A for reasons of simplicity.

Furthermore, the mask components 110B-106B may have different sizes from one another, and the slots/openings 110B-115B may have different sizes from one another. These varying sizes are also not specifically illustrated in the cross-sectional view of FIG. 8A for reasons of simplicity. And similar to the implant mask layers 80 and 80A, the implant mask layer 80B will also result in a lower dopant concentration level to the regions of the substrate underneath. This results in the following mathematical relationship:

a dopant concentration level of the region corresponding to the doped region 210 in FIG. 5/the dopant concentration level of the region corresponding to the doped region 180 in FIG. 5=a total area of the openings of the implant mask layer 80B/(a total area of the openings of the implant mask layer 80B+a total area of the mask components of the implant mask layer 80B)

The implant mask layer 80 shown in FIGS. 2A-2B may be said to have a V-slot shape, the implant mask layer 80A shown in FIGS. 7A-7B may be said to have a P-slot shape, and the implant mask layer 80B shown in FIGS. 8A-8B may be said to have a V'-slot shape. The use of these implant mask layers by the various embodiments described above offers advantages over existing methods of fabricating high-voltage semiconductor devices. It is understood, however, that other embodiments may offer different advantages, and that no particular advantage is required for all embodiments.

One advantage is that it improves the breakdown voltage of the semiconductor device without increasing the on-state resistance of the device. A region located near the source tip and between the source and the drain can be referred to as a buffer region (or a source tip region). In traditional devices, this buffer region is often times completely doped or completely un-doped. When the buffer region is completely doped, it results in a strong electric field in the buffer region, which degrades the breakdown voltage of the device. When the buffer region is completely un-doped, the breakdown voltage may improve, but the on-state resistance will become higher, which is undesirable.

In comparison, the use of the implant mask layer 80/80A/80B herein allows the buffer region (the source tip region) to become doped, but with a dopant concentration level that is lower than the nearby regions. This leads to a weaker electric field, which increases the breakdown voltage of the semiconductor device. Meanwhile, the doping of the buffer region also results in a reduced on-state resistance. Hence, an optimal balance (or tradeoff) can be achieved between the breakdown voltage and the on-state resistance.

The improvement in breakdown voltage over traditional devices can be quite good. For example, a traditional high-voltage device may only have a breakdown voltage as high as about 200 volts. Here, in an embodiment using the V-slot shaped implant mask layer illustrated in FIGS. 2A-2B, the breakdown voltage can reach about 410 volts. In an embodiment using the P-slot shaped implant mask layer illustrated in FIGS. 7A-7B, the breakdown voltage can reach about 520 volts. In an embodiment using the V'-slot shaped implant mask layer illustrated in FIGS. 8A-8B, the breakdown voltage can reach about 800 volts.

Another advantage of the present disclosure is that no extra fabrication processes are needed to carry out the implementation of the implant mask layer. The implant mask layer can be formed at the same time when the other implant mask layers are formed as a part of the drift region implantation. Stated differently, only the layout of the photomask needs to be adjusted to form the implant mask layers here. No additional photomasks are needed. Additional ion implantation processes are not needed either to form the buffer region with reduced dopant concentration level. Rather, the dopant concentration level of the buffer region can be adjusted by controlling the sizes of the openings of the implant mask layer. When the wafer is annealed later, the dopant ions will diffuse sufficiently into the neighboring areas in the buffer region that are previously un-doped, thus resulting in a buffer region having a relatively uniform and reduced dopant concentration level compared to other areas of the substrate. Also, the techniques offered by the present disclosure can also be easily merged into other ultra-high voltage technology processes.

One of the broader forms of the present disclosure involves a method of fabricating a high-voltage semiconductor device. The method includes: forming an implant mask layer over a substrate, the implant mask layer having a plurality of mask components separated by a plurality of openings, wherein the openings are aligned with a plurality of first regions of the substrate, respectively, and the mask components are aligned with a plurality of second regions of the substrate, respectively; implanting dopant ions into the first regions through the openings; and annealing the substrate to cause the implanted dopant ions to diffuse from the first regions into the second regions in a manner such that dopant concentration levels of the first regions are approximately equal to dopant concentration levels of the second regions after the annealing.

Another one of the broader forms of the present disclosure involves a method of fabricating a high-voltage semiconductor device. The method includes: designating first, second, and third regions in a substrate, wherein the first and second regions are regions where a source and a drain of the semiconductor device will be formed, respectively, and wherein the third region separates the first and second regions; forming a slotted implant mask layer at least partially over the third region; implanting dopants into the first, second, and third regions, the slotted implant mask layer protecting portions of the third region therebelow during the implanting; and annealing the substrate in a manner to cause diffusion of the dopants in the third region.

Yet one more of the broader forms of the present disclosure involves a high-voltage semiconductor device. The high-voltage semiconductor device includes: a substrate having first, second, and third regions, the first and second regions having different doping polarities and being separated by the third region, the third region having the same doping polarity as the second region and a lower dopant concentration level than the second region; a source formed in the substrate and over the first region, the source and the first region having different doping polarities; a drain formed in the substrate and over the second region, the drain and the second region having the same doping polarity; and a gate formed over a portion of the third region, the gate being formed closer to the source than to the drain.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further embodiments may also include, but are not limited to, vertical diffused metal-oxide-semiconductor (VDMOS), other types of high power MOS transistors, Fin structure field effect transistors (FinFET), and strained MOS structures.

What is claimed is:

1. A semiconductor device, comprising:
a substrate having first, second, and third regions, the first and second regions having different doping polarities and being separated by the third region, the third region having the same doping polarity as the second region and a lower dopant concentration level than the second region, wherein a portion of the substrate is interposed between an edge of the first region and an edge of the third region, wherein the portion of the substrate has the same doping polarity as the first region, wherein the portion of the substrate is different than the first region and is between a top surface of the substrate and the first region, wherein the first region extends into the third region within the substrate;
a source formed in the substrate and over the first region, the source and the first region having different doping polarities;
a drain formed in the substrate and over the second region, the drain and the second region having the same doping polarity; and
a gate formed over a portion of the third region, the gate being formed closer to the source than to the drain.

2. The semiconductor device of claim 1, wherein the first region has a portion that protrudes toward the third region.

3. The semiconductor device of claim 1, further including a dielectric structure formed over the third region, wherein the gate is formed on a portion of the dielectric structure.

4. The semiconductor device of claim 1, wherein a portion of the source adjacent to the third region has a curved profile from a top view.

5. The semiconductor device of claim 4, wherein the portion of the source having the curved profile is at least partially surrounded by the third region.

6. The semiconductor device of claim 1, further comprising a fourth region disposed over the first region, the source and the fourth region having different doping polarities and the fourth region having a greater doping concentration than the first region.

7. A device comprising:
   a first doped region of a first dopant type disposed within a substrate, the first doped region having a first doping concentration level;
   a second doped region of the first dopant type within the substrate, the second doped region having a second doping concentration level that is different than the first doping concentration level;
   a doped extension region disposed within the first doped region and extending into the second doped region within the substrate, the doped extension region being formed of a second dopant type that is opposite the first dopant type, and
   wherein a portion of the substrate is interposed between the first doped region and the second doped region, wherein the portion of the substrate is formed of the second dopant type, wherein the portion of the substrate is different than the doped extension region and is between a top surface of the substrate and the doped extension region.

8. The device of claim 7, further comprising a third doped region that interfaces with the second doped region, the third doped region being formed of the first dopant type and has a third doping concentration that is different than the second doping concentration.

9. The device of claim 8, further comprising a fourth doped region that is disposed over and interfaces with the third doped region, the fourth doped region being formed of the first dopant type and has a fourth doping concentration that is different than the third doping concentration.

10. The device of claim 7, further comprising:
    a third doped region disposed over and interfaces with doped extension region, the third doped region being formed of the first dopant type and has a third doping concentration that is different than the first doping concentration; and
    a fourth doped region that is disposed over and interfaces with the doped extension region, the fourth doped region being formed of the second dopant type and has a doping concentration that is different than a doping concentration of the doped extension region.

11. The device of claim 7, further comprising:
    an isolation structure disposed over the portion of the substrate; and
    a gate structure disposed over the isolation structure.

12. A device comprising:
    a first doped region of a first dopant type disposed within a substrate, the first doped region having a first doping concentration level;
    a second doped region of the first dopant type disposed within the substrate, the first doped region having a second doping concentration level that is different than the first doping concentration level;
    a third doped region of the first dopant type within the substrate, the third doped region having a third doping concentration level that is different than the second doping concentration level; and
    a doped extension region disposed within the first doped region and extending into the second doped region within the substrate, the doped extension region being formed of a second dopant type that is opposite the first dopant type, and
    wherein a portion of the substrate formed of the second dopant type is positioned between the first doped region and the second doped region, wherein the portion of the substrate is different than the doped extension region and extends from the doped extension region to a top surface of the substrate.

13. The device of claim 12, further comprising a gate structure disposed directly over the portion of the substrate.

14. The device of claim 13, wherein the gate structure includes a gate dielectric layer and a gate electrode, and
    wherein the portion of the substrate interfaces with the gate dielectric layer.

15. The device of claim 12, further comprising a first heavily doped region disposed within the third doped region, the first heavily doped region formed of the first dopant type and has a fourth doping concentration level that is different than the third concentration level.

16. The device of claim 15, further comprising a second heavily doped region disposed within the first doped region over the doped extension region, the second heavily doped region formed of the first dopant type and has a fifth doping concentration level that is different than the first concentration level.

17. The device of claim 16, further comprising another doped region disposed within the first doped region adjacent to the second heavily doped region, the another doped region formed of the second dopant type.

18. The device of claim 17, wherein the a doped extension region has a sixth doping concentration level, and
    wherein the another doped region has a seventh doping concentration level that is different than the sixth concentration level.

19. The device of claim 12, wherein the portion of the substrate extends from the doped extension region to the second doped region.

20. The semiconductor device of claim 1, wherein the gate includes a gate dielectric layer and a gate electrode, and
    wherein the portion of the substrate interfaces with the gate dielectric layer.

* * * * *